United States Patent
Koreeda

(10) Patent No.: US 11,967,941 B2
(45) Date of Patent: Apr. 23, 2024

(54) ACOUSTIC WAVE DEVICE AND COMPOSITE FILTER DEVICE

(71) Applicant: Murata Manufacturing Co., Ltd., Nagaokakyo (JP)

(72) Inventor: Toshishige Koreeda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 605 days.

(21) Appl. No.: 17/315,402

(22) Filed: May 10, 2021

(65) Prior Publication Data

US 2021/0376811 A1    Dec. 2, 2021

(30) Foreign Application Priority Data

May 29, 2020    (JP) .................. 2020-094562

(51) Int. Cl.
  *H03H 9/05*    (2006.01)
  *H03H 9/02*    (2006.01)
  *H03H 9/64*    (2006.01)

(52) U.S. Cl.
  CPC ........ *H03H 9/059* (2013.01); *H03H 9/02543* (2013.01); *H03H 9/02834* (2013.01); *H03H 9/6483* (2013.01)

(58) Field of Classification Search
  CPC ............... H03H 9/059; H03H 9/02543; H03H 9/02834; H03H 9/6483; H03H 9/1085;
  (Continued)

(56) References Cited

U.S. PATENT DOCUMENTS

2005/0146397 A1* 7/2005 Koga .................. H03H 9/0576
                                                          333/133
2010/0225202 A1* 9/2010 Fukano ................. H03H 9/105
                                                          310/313 C
(Continued)

FOREIGN PATENT DOCUMENTS

JP    2006147726 A    6/2006
JP    2006-202918 A   8/2006
(Continued)

OTHER PUBLICATIONS

Office Action in JP2020-094562, mailed Nov. 8, 2022, 5 pages.

*Primary Examiner* — Emily P Pham
(74) *Attorney, Agent, or Firm* — Keating & Bennett, LLP

(57) ABSTRACT

An acoustic wave device includes a mounting substrate, and an acoustic wave element chip. The mounting substrate includes a first major surface with a bump-mounting electrode land thereon, and a second major surface facing the first major surface. The acoustic wave element chip includes a piezoelectric substrate including a major surface, and a functional electrode and a bump located over the major surface of the piezoelectric substrate. The bump is joined to the bump-mounting electrode land. A heat radiation pattern is located over the first major surface of the mounting substrate and located within a region facing the functional electrode of the acoustic wave element chip. The heat radiation pattern is connected to an internal layer portion of the mounting substrate between the first and second major surfaces, and not electrically connected to the bump-mounting electrode land on the first major surface.

20 Claims, 10 Drawing Sheets

(58) Field of Classification Search
CPC ........ H03H 9/64; H03H 9/05; H03H 9/02102; H03H 9/14541; H03H 9/725
See application file for complete search history.

(56) References Cited

U.S. PATENT DOCUMENTS

2012/0086524 A1   4/2012   Komura
2018/0159499 A1   6/2018   Nakazawa et al.

FOREIGN PATENT DOCUMENTS

| JP | 2009-225198 A | 10/2009 |
| JP | 2010073943 A | 4/2010 |
| JP | 2012-085112 A | 4/2012 |
| JP | 2018-093389 A | 6/2018 |

\* cited by examiner

ACOUSTIC WAVE DEVICE AND COMPOSITE FILTER DEVICE

CROSS REFERENCE TO RELATED APPLICATIONS

This application claims the benefit of priority to Japanese Patent Application No. 2020-094562 filed on May 29, 2020. The entire contents of this application are hereby incorporated herein by reference.

BACKGROUND OF THE INVENTION

1. Field of the Invention

The present invention relates to an acoustic wave device with an acoustic wave element chip mounted over a mounting substrate.

2. Description of the Related Art

Multiplexers or other devices that include a surface acoustic wave filter are in widespread use. Multiplexers or other devices of this type include multiple acoustic wave elements provided on a piezoelectric substrate. The piezoelectric substrate with the acoustic wave elements provided thereon is mounted to a mounting substrate by use of a bump or other connections. In an acoustic wave device described in Japanese Unexamined Patent Application Publication No. 2018-093389, an insulating film is provided on the mounting substrate facing each acoustic wave element to thereby improve dissipation of heat from the acoustic wave element. Heat from each acoustic wave element is dissipated through the insulating film. The insulating film is provided so as to extend over a region facing multiple acoustic wave elements.

With the acoustic wave device described in Japanese Unexamined Patent Application Publication No. 2018-093389, the higher thermal conductivity of the insulating film than that of air is exploited to improve heat dissipation. However, in some cases, sufficient heat dissipation may not be provided.

SUMMARY OF THE INVENTION

Preferred embodiments of the present invention provide acoustic wave devices that each achieve improved heat dissipation.

An acoustic wave device according to a preferred embodiment of the present invention includes a mounting substrate, and an acoustic wave element chip. The mounting substrate includes a first major surface and a second major surface that face each other, the first major surface being a major surface on which a bump-mounting electrode land used for bump mounting is provided. The acoustic wave element chip includes a piezoelectric substrate including a major surface, and a functional electrode and a bump used for mounting, the functional electrode and the bump being located over the major surface of the piezoelectric substrate. The bump of the acoustic wave element chip is joined to the bump-mounting electrode land located on the first major surface of the mounting substrate. The acoustic wave device further includes a heat radiation pattern located over the first major surface of the mounting substrate, the heat radiation pattern being located within a region facing the functional electrode of the acoustic wave element chip. The heat radiation pattern is connected to an internal layer portion of the mounting substrate located between the first major surface and the second major surface. The heat radiation pattern is not electrically connected to the bump-mounting electrode land on the first major surface.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention are described below with reference to the drawings to facilitate understanding of the present invention.

It is to be noted that various preferred embodiments described herein are for illustrative purposes only, and some features or elements described with respect to different preferred embodiments may be substituted for or combined with one another.

Figure 1A:
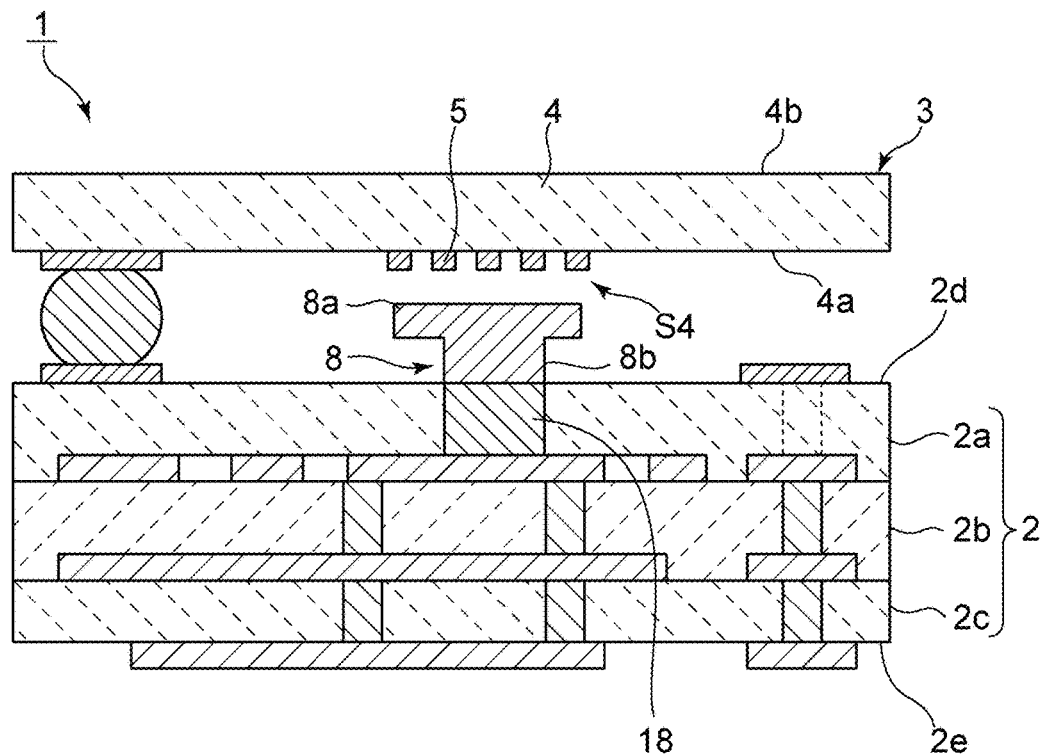
FIGS. 1A and 1B are front cross-sectional views of an acoustic wave device according to a first preferred embodiment of the present invention.
Figure 1B:
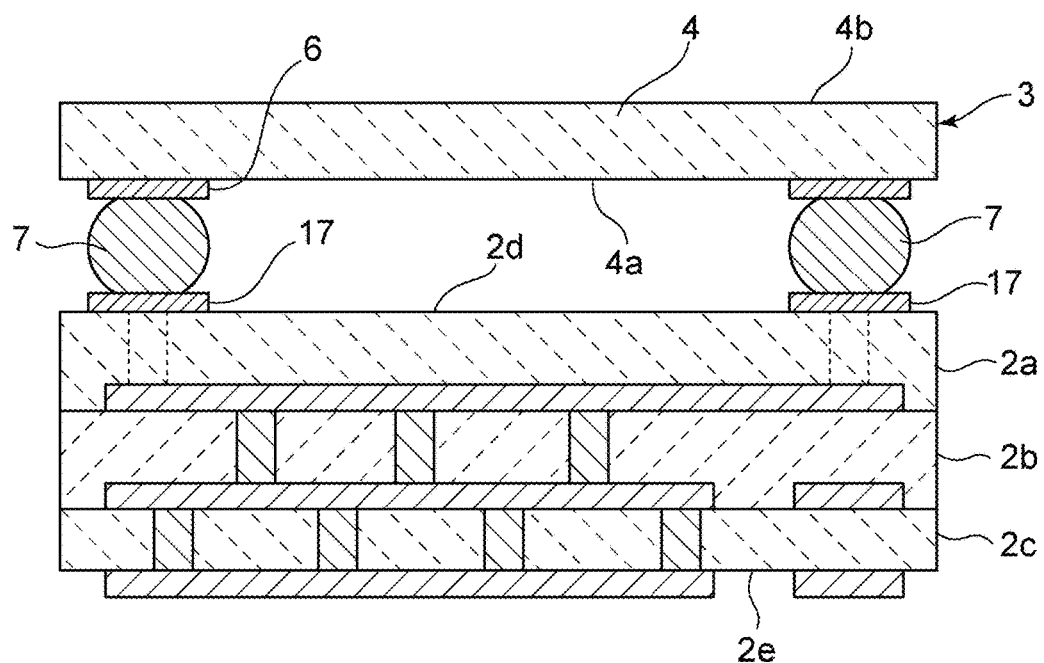

FIGS. 1A and 1B are front cross-sectional views of an acoustic wave device according to a first preferred embodiment of the present invention.

An acoustic wave element chip 3 is mounted over a mounting substrate 2 by use of a bump 7.

The mounting substrate 2 is a multilayer substrate including multiple substrate layers 2a to 2c. The mounting substrate 2 is made of a suitable insulating material such as an insulating ceramic material or a synthetic resin. The mounting substrate 2 includes a first major surface 2d, and a second major surface 2e facing the first major surface 2d. The acoustic wave element chip 3 is mounted over the first major surface 2d by use of the bump 7. The acoustic wave element chip 3 includes a piezoelectric substrate 4. The piezoelectric substrate 4 includes first and second major surfaces 4a and 4b that face each other. A functional electrode 5 is located on the first major surface 4a. In the first preferred embodiment, the functional electrode 5 is an interdigital transducer (IDT) electrode. The functional electrode 5 may be an electrode other than an IDT electrode, as long as such an electrode is used to excite an acoustic wave.

An electrode land 6 is located on the first major surface 4a. The electrode land 6 is electrically connected to the functional electrode 5. The bump 7 made of metal is located on the electrode land 6. The bump 7 is joined to an electrode land 17, which is an electrode land used for mounting purposes and located on the first major surface 2d of the mounting substrate 2.

The piezoelectric substrate 4 is made of a piezoelectric single crystal such as $LiTaO_3$ or $LiNbO_3$. In another example, the piezoelectric substrate 4 may be made of a piezoelectric ceramic material. In another example, the piezoelectric substrate 4 may include a piezoelectric film stacked directly or indirectly on a support substrate.

Figure 2:
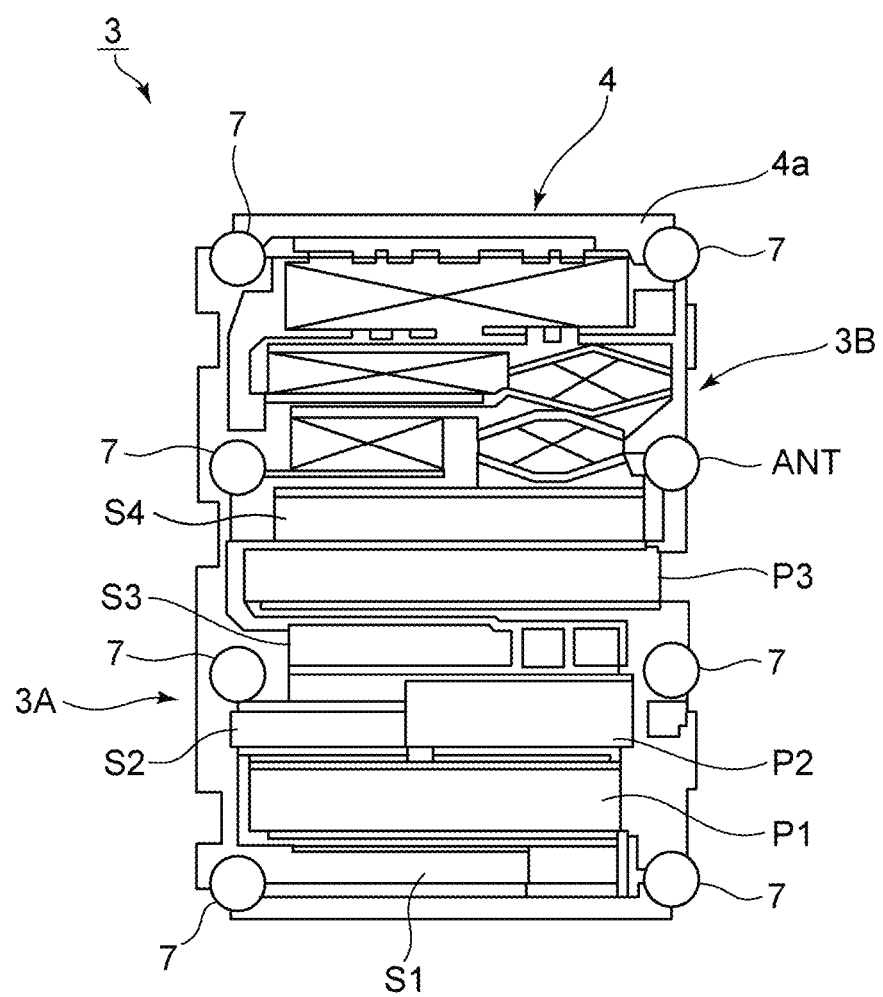
FIG. 2 is a plan view of an acoustic wave element chip used in the acoustic wave device according to the first preferred embodiment of the present invention.

FIG. 2 is a plan view, as seen from the side of the acoustic wave element chip 3 corresponding to the first major surface 4a, of an electrode structure located on the first major surface 4a of the piezoelectric substrate 4 of the acoustic wave element chip 3. The acoustic wave element chip 3 is a duplexer including a transmitting filter 3A, and a receiving filter 3B. The transmitting filter 3A is a ladder filter with multiple acoustic wave resonators.

Figure 3:
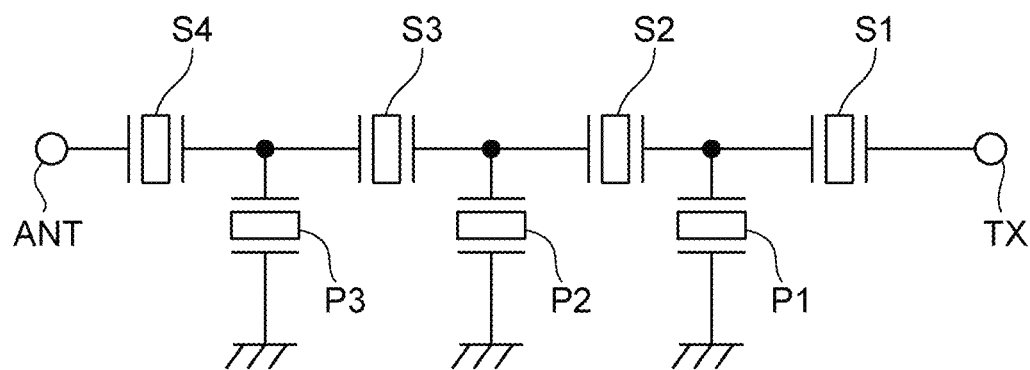
FIG. 3 is a circuit diagram of a transmitting filter in the acoustic wave device according to the first preferred embodiment of the present invention.

FIG. 3 is a circuit diagram of the transmitting filter 3A. Multiple series-arm resonators S1 to S4 are located on a series arm that connects a transmitting terminal TX with an antenna terminal ANT. Parallel-arm resonators P1, P2, and P3 are each located on the corresponding one of parallel arms each connecting the series arm with a reference potential.

The series-arm resonators S1 to S4 and the parallel-arm resonator P1 to P3 are each a one-port surface acoustic wave resonator including an IDT electrode. In FIG. 2, only a region where each acoustic wave resonator is located is depicted schematically.

The receiving filter 3B is an acoustic wave filter with multiple acoustic wave resonators.

The acoustic wave element chip 3 is coupled to the first major surface 2d of the mounting substrate 2 described above by use of the bump 7 illustrated in FIG. 2. The acoustic wave element chip 3 is thus mounted to the mounting substrate 2.

Figure 4:
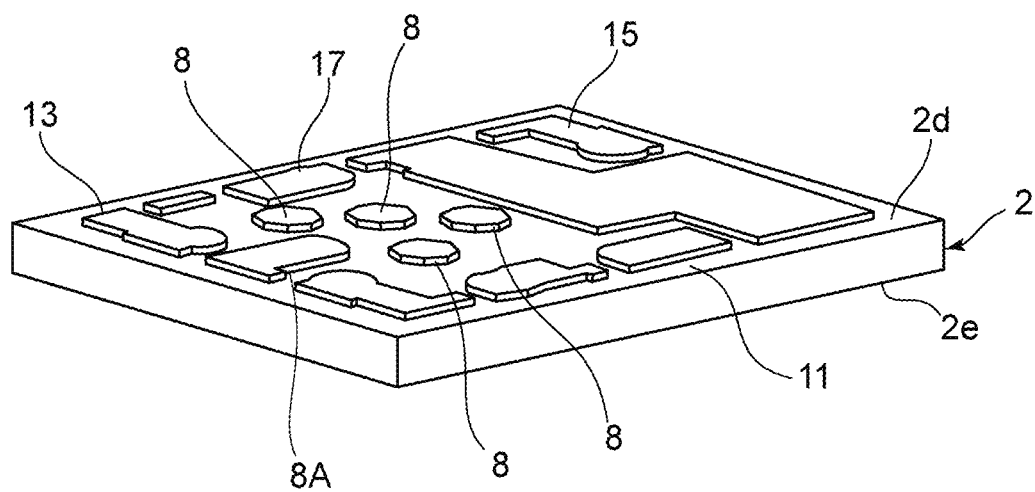
FIG. 4 is a perspective view of a mounting substrate used in the acoustic wave device according to the first preferred embodiment of the present invention.
Figure 5:
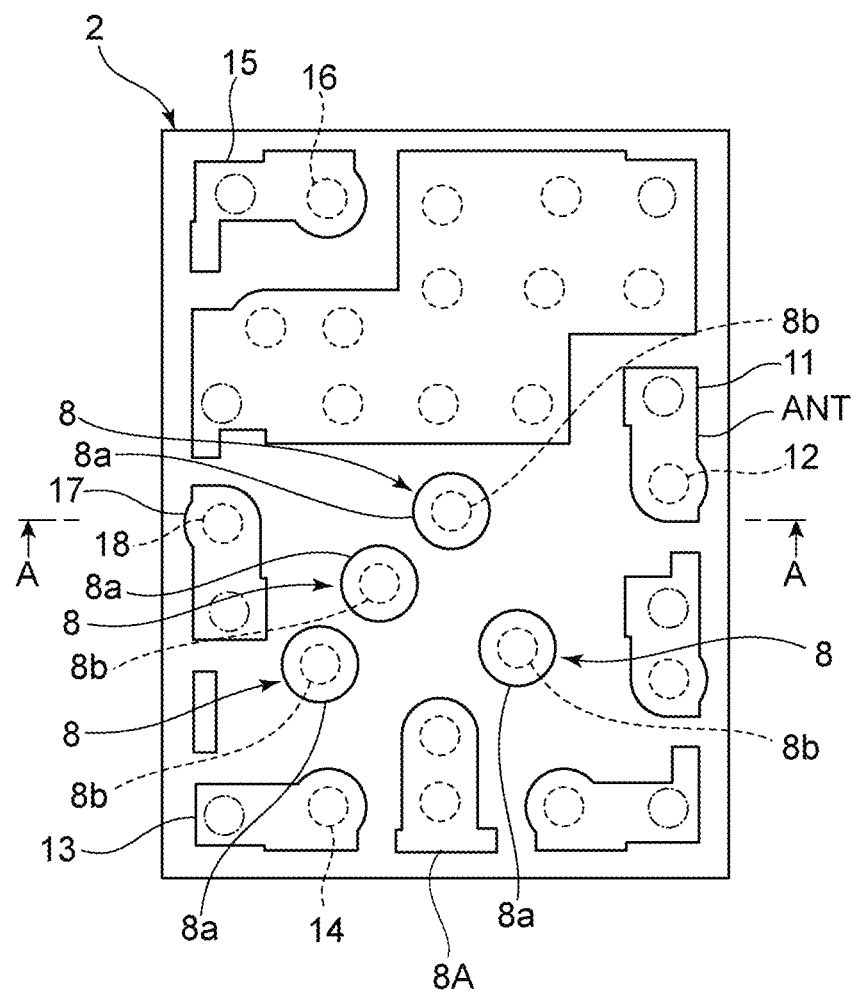
FIG. 5 is a plan view of an electrode structure on a first major surface of the mounting substrate used in the acoustic wave device according to the first preferred embodiment of the present invention.
Figure 6:
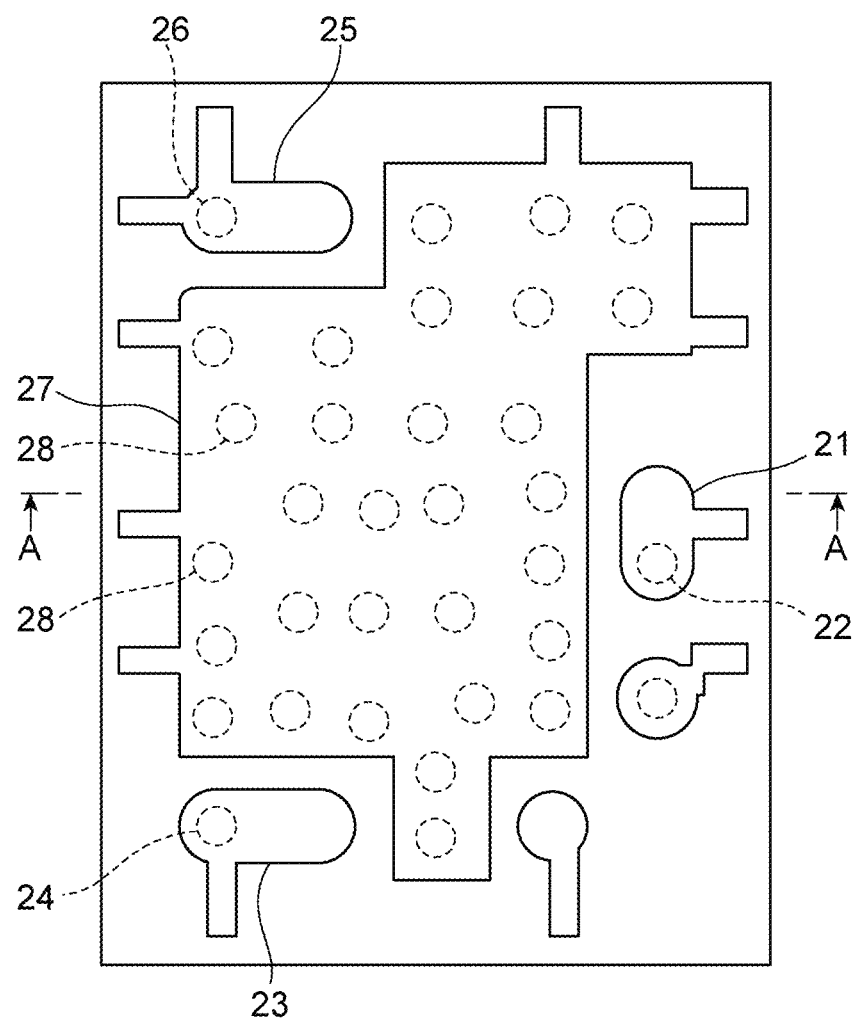
FIG. 6 is a plan view of an electrode structure on an internal layer located below the first major surface of the mounting substrate used in the acoustic wave device according to the first preferred embodiment of the present invention.
Figure 7:
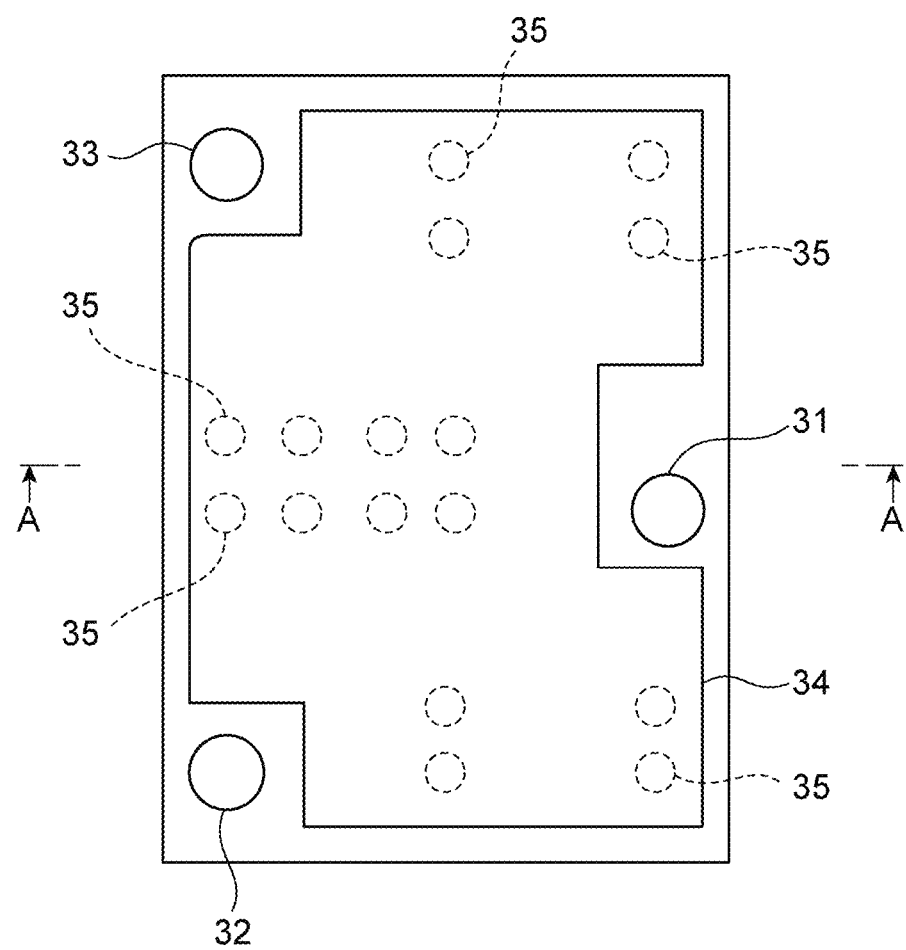
FIG. 7 is a plan view of an electrode structure on an internal layer located below the internal layer illustrated in FIG. 6 and located in the interior of the mounting substrate used in the acoustic wave device according to the first preferred embodiment of the present invention.

FIG. 4 is a perspective view of the mounting substrate 2. FIG. 5 is a plan view of an electrode structure located on the first major surface 2d of the mounting substrate 2. FIG. 6 is a plan view of an electrode structure located on an internal layer of the mounting substrate 2. More specifically, FIG. 6 illustrates an electrode structure located at the interface between the substrate layers 2a and 2b illustrated in FIG. 1A. FIG. 7 is a plan view of an electrode structure located on an internal layer located below the electrode structure illustrated in FIG. 6. More specifically, FIG. 7 illustrates an electrode structure located at the interface between the substrate layers 2b and 2c illustrated in FIG. 1A.

Figure 8:
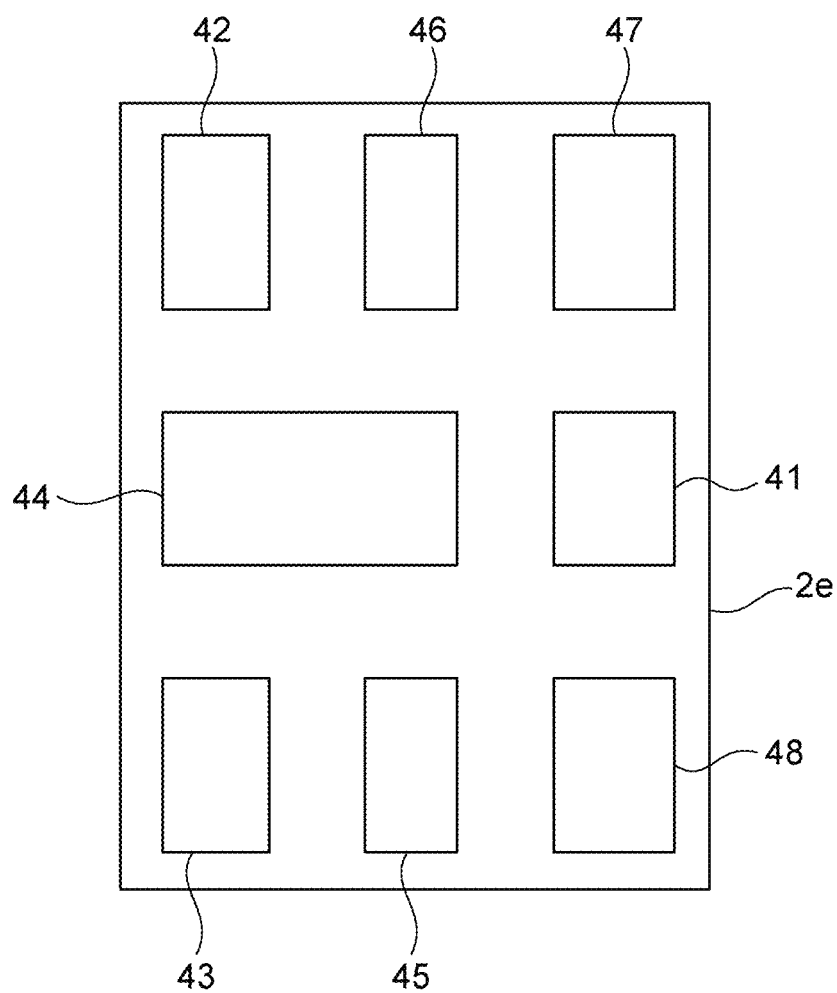
FIG. 8 is a plan view of an electrode structure on a second major surface of the mounting substrate used in the acoustic wave device according to the first preferred embodiment of the present invention.
Figure 9:
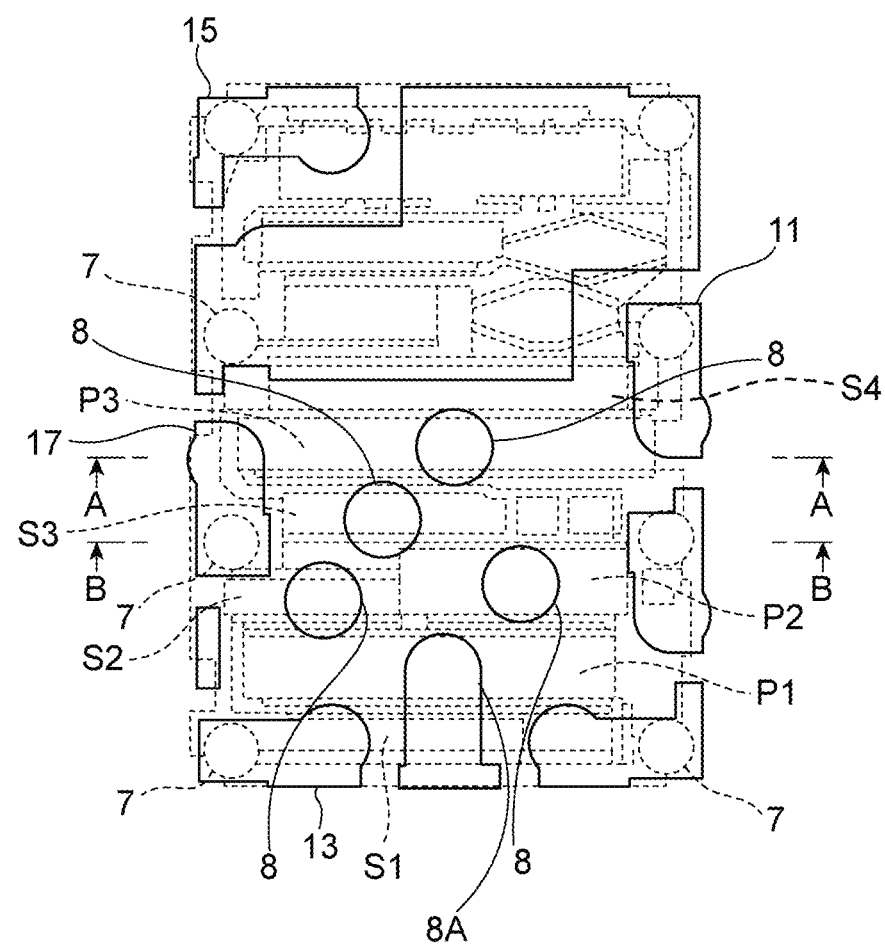
FIG. 9 is a schematic plan view of the acoustic wave device according to the first preferred embodiment of the present invention.

FIG. 8 is a plan view of an electrode structure located on the second major surface 2e of the mounting substrate 2. FIG. 9 is a schematical plan view of the electrode structure on the mounting substrate 2, with electrodes on the first major surface 4a of the acoustic wave element chip 3 being located over the electrode structure. In FIG. 9, the electrode structure on the first major surface 2d of the mounting substrate 2 is indicated by solid lines. The electrodes on the first major surface 4a of the acoustic wave element chip 3 are indicated by broken lines.

As illustrated in FIG. 1A, in an acoustic wave device 1, the IDT electrode serving as the functional electrode 5 of the acoustic wave element chip 3 faces the first major surface 2d of the mounting substrate 2. A heat radiation pattern 8 is located within a region of the first major surface 2d of the mounting substrate 2 that faces the functional electrode 5. In the first preferred embodiment, the heat radiation pattern 8 includes a heat receiver portion 8a, which faces the functional electrode 5, and a heat transfer portion 8b, which has a smaller cross-sectional area than the heat receiver portion 8a. As illustrated in FIG. 1A, the heat receiver portion 8a of the heat radiation pattern 8 is located proximate to the functional electrode 5 of the acoustic wave element chip 3. As for the acoustic wave element chip 3, during driving, the piezoelectric substrate 4 is subjected to an elevated temperature in a location where the functional electrode 5 is located. Thus, heat generated during driving is transferred toward the heat radiation pattern 8 by radiation. This allows heat to be quickly dissipated through the heat radiation pattern 8.

The electrode structure of the mounting substrate 2 is described below in detail with reference to FIGS. 5 to 8.

As illustrated in FIG. 5, electrode lands 11, 13, 15, and 17, which are electrode lands used for mounting purposes, are located on the first major surface 2d. The bump 7 of the acoustic wave element chip 3 is joined to each of the electrode lands 11, 13, 15, and 17. In the acoustic wave device 1, eight bumps are actually used in mounting the acoustic wave element chip 3 to the mounting substrate 2. In FIG. 5, circles indicated by alternate long and short dash lines represent the eight bumps. Of the eight bumps, a total of four bumps 7 are used as representative bumps to explain the coupling mentioned above. The four bumps 7 include a bump connected to a ground potential near the antenna terminal ANT, a bump connected to a ground potential near the transmitting terminal TX, a bump connected to a ground potential near the receiving terminal, and a bump connected to a ground potential near the heat radiation pattern 8.

The electrode land 11, which is an electrode land used for mounting purposes, is connected to the antenna terminal of the acoustic wave element chip 3. The electrode land 11 is connected to the upper end of a via-conductor 12. The via-conductor 12 is connected at the lower end to an electrode 21 illustrated in FIG. 6. The upper end of a via-conductor 22 is connected to the electrode 21. The via-conductor 22 is connected to the upper end of a via-conductor 31 illustrated in FIG. 7. The via-conductor 31 is connected at the lower end to an outer electrode 41 illustrated in FIG. 8. The outer electrode 41 is connected to an antenna.

The upper end of a via-conductor 14 is connected to the electrode land 13 illustrated in FIG. 5. The via-conductor 14 is connected at the lower end to an electrode 23 illustrated in FIG. 6. The upper end of a via-conductor 24 is connected to the electrode 23. The via-conductor 24 is connected at the lower end to a via-conductor 32 illustrated in FIG. 7. The via-conductor 32 is connected to an outer electrode 43 illustrated in FIG. 8. The outer electrode 43 serves as an input electrode that receives an input of transmitting power.

More specifically, a transmitting signal input from an outer electrode 42 is output to the antenna from the outer electrode 41 after passing through the antenna terminal via the transmitting filter 3A.

The transmitting filter 3A, which is a ladder filter, is connected in between the outer electrode 41 and the outer electrode 42.

The respective heat transfer portions 8b of multiple heat radiation patterns 8 are connected to an electrode 27 located in the interior of the mounting substrate 2. That is, each heat radiation pattern 8 is connected to the exterior portion of the mounting substrate 2. This allows heat to quickly escape to the internal layer portion of the mounting substrate 2.

The electrode 27 has an enlarged area. The upper ends of multiple via-conductors 28 are connected to the electrode 27. The via-conductors 28 are connected at the lower end to an electrode 34 illustrated in FIG. 7, which has an enlarged area. The upper ends of multiple via-conductors 35 are connected to the lower surface of the electrode 34.

The via-conductors 35 are each connected at the lower end to an outer electrode 44, 45, 46, or 47 illustrated in FIG. 8. The outer electrodes 44, 45, 46, and 47 are electrodes each connected to the ground potential.

Accordingly, in the first preferred embodiment, the heat radiation pattern 8 is eventually connected to the ground potential. Heat is thus allowed to escape to the outside through the outer electrodes 44, 45, 46, and 47. Further, the heat radiation pattern 8 is connected to the electrode 27 illustrated in FIG. 6, which has an enlarged area. This allows heat to escape toward the electrode 27 more effectively. The electrode 27 is connected to the outer electrode 44 located on the second major surface 2e of the mounting substrate 2 by way of the via-conductors 28, the electrode 34, and the via-conductors 35. In this way, the heat radiation pattern 8 is coupled to the outer electrode 44, and heat is allowed to escape from the heat radiation pattern 8 toward the second major surface 2e through the internal layers of the mounting substrate 2.

As illustrated in FIGS. 4 and 5, multiple heat radiation patterns 8 are located on the first major surface 2d of the mounting substrate 2. In FIG. 4, the heat receiver portion of each heat radiation pattern 8 is depicted as having a substantially regular polygonal planar shape. In FIG. 5 and other figures, however, for ease of illustration, each heat radiation pattern 8 and the corresponding heat receiver portion 8a are depicted as having a substantially circular planar shape.

The acoustic wave element chip 3 includes multiple functional electrodes 5. That is, the series-arm resonators S1 to S4, and the parallel-arm resonator P1 to P3 each include an IDT electrode serving as the functional electrode 5.

The heat radiation patterns 8 are located so as to face, in one-to-one correspondence, the functional electrodes 5, that is, the IDT electrodes of the series-arm resonators S2 and S3 and parallel-arm resonators P2 and P3. This allows heat generated in the series-arm resonators S2 and S3 and the parallel-arm resonators P2 and P3 to quickly escape toward the mounting substrate 2. Therefore, the acoustic wave device 1 with improved heat dissipation can be provided.

On the first major surface 2d, the heat radiation patterns 8 are not electrically connected to the electrode land 17. This configuration allows heat to quickly escape from each heat radiation pattern 8 to the internal layer portion of the mounting substrate 2. A heat radiation pattern 8A is located in addition to the heat radiation patterns 8. The heat radiation pattern 8A is positioned to face both the IDT electrode of the series-arm resonator S1 and the IDT electrode of the parallel-arm resonator P1. As described above, the heat radiation pattern 8A extending over multiple IDT electrodes may be provided in addition to the heat radiation patterns 8, which face the IDT electrodes in one-to-one correspondence.

The transmitting filter 3A may not necessarily be the ladder filter mentioned above. Alternatively, the transmitting filter 3A may be another type of bandpass filter with multiple acoustic wave resonators. The receiving filter 3B is not limited to a specific circuit configuration. A portion of the acoustic wave element chip 3 where the transmitting filter 3A is located is a preferred embodiment of the present invention.

The heat radiation pattern 8 is provided in order to dissipate heat. As such, the heat radiation pattern 8 is made of a material with superior thermal conductivity. Although any material with a higher thermal conductivity than air may be used, it is desirable to use a high thermal conductivity material such as a metal. Alternatively, however, the heat radiation pattern 8 may be made of an insulating ceramic material such as alumina.

In the foregoing description of the first preferred embodiment, the heat radiation pattern 8 includes the heat receiver portion 8a with a relatively large area that contiguously extends to the heat transfer portion 8b with a relatively small area. Alternatively, however, the heat transfer portion 8b may include the same cross-sectional area as the heat receiver portion 8a.

In the foregoing description of the first preferred embodiment, the heat radiation pattern 8 is eventually connected to the outer electrode 44, 45, 46, or 47. Alternatively, however, the heat radiation pattern 8 may be electrically connected to a floating electrode other than an outer electrode connected to the ground potential.

It is desirable, however, that the heat radiation pattern 8 is not electrically connected to the outer electrode 41, the outer electrode 42, and the outer electrode 43. Otherwise, heat may be transmitted to another acoustic wave resonator via an electrical path.

In the foregoing description of the first preferred embodiment, the heat radiation pattern 8 is located so as to face the IDT electrode of each of the series-arm resonators S2 and S3 and parallel-arm resonators P2 and P3 of the ladder filter. As described above, according to preferred embodiments of the present invention, each single heat radiation pattern 8 faces a single IDT electrode, and the single heat radiation pattern 8 does not face multiple IDT electrodes. That is, each single heat radiation pattern 8 preferably does not overlap two or more IDT electrodes in plan view. This allows heat generated in each IDT electrode to escape toward the mounting substrate 2 more quickly. By contrast, as described above, the heat radiation pattern 8A is located so as to face both the IDT electrode of the series-arm resonator S1 and the IDT electrode of the parallel-arm resonator P1.

In the ladder filter, preferably, the heat radiation pattern is located so as to face the IDT electrode of a series-arm resonator other than the series-arm resonator having the highest resonant frequency, or the IDT electrode of a parallel-arm resonator other than the parallel-arm resonator having the lowest anti-resonant frequency. In this case, the heat radiation pattern is located so as to face a series-arm resonator or parallel-arm resonator that is likely to generate heat. This helps to further improve heat radiation.

Preferably, the heat radiation pattern is located so as to face the IDT electrode of a series-arm resonator other than the series-arm resonator with the largest total capacitance, or the IDT electrode of a parallel-arm resonator other than the parallel-arm resonator with the smallest total capacitance. In this case as well, the heat radiation pattern is located so as to face a series-arm resonator or parallel-arm resonator that generates a large amount of heat. This helps to effectively improve the heat dissipation of the acoustic wave device.

The distance between the functional electrode 5 and the heat radiation pattern 8 is preferably less than or equal to about 70 µm, for example. This helps to further improve heat dissipation. More preferably, the above-mentioned distance is less than or equal to about 30 µm, for example. This helps to further improve heat dissipation due to radiant heat.

If the heat radiation pattern 8 has the same area as the corresponding via-conductor, the area required to provide the heat radiation pattern 8 on the first major surface 2d of the mounting substrate 2 can be reduced. Preferably, if multiple functional electrodes 5 are provided, the heat radiation pattern 8 faces the IDT electrode of the resonator that generates the greatest amount of heat per unit time. This allows heat dissipation to be effectively improved by use of fewer heat radiation patterns 8.

An example of the transmitting filter 3A of the acoustic wave device 1 according to the first preferred embodiment, which is hereinafter referred to as "Example", is fabricated with design parameters described below.

The configurations of the series-arm resonators and parallel-arm resonators are as represented in Table 1 below.

TABLE 1

| | IDT | | REFLECTOR |
|---|---|---|---|
| | NUMBER OF PAIRS | λ (µm) | NUMBER OF REFLECTORS |
| S1 | 120 | 3.99 | 12 |
| S2 | 85 | 4.02 | 11 |
| S3 | 104 | 4.00 | 14 |
| S4 | 187 | 4.06 | 14 |
| P1 | 164 | 4.22 | 14 |
| P2 | 88 | 4.21 | 12 |
| P3 | 190 | 4.23 | 14 |

As for the electrode material, a multilayer electrode with a Pt/Al electrode as its main electrode is used.

The heat radiation pattern 8 made of Cu as its main component is located so as to face the IDT electrode of each resonator. The heat receiver portion 8a of the heat radiation pattern 8 has an area of about 0.018 mm$^2$ and a thickness of about 0.014 mm, and the heat transfer portion 8b has a cross-sectional area of about 0.002 mm$^2$ and a length of about 0.025 mm, for example.

An acoustic wave device according to Comparative Example was fabricated to have the same configuration as that of the acoustic wave device according to Example, except that the above-mentioned heat radiation pattern was not provided.

Figure 10:
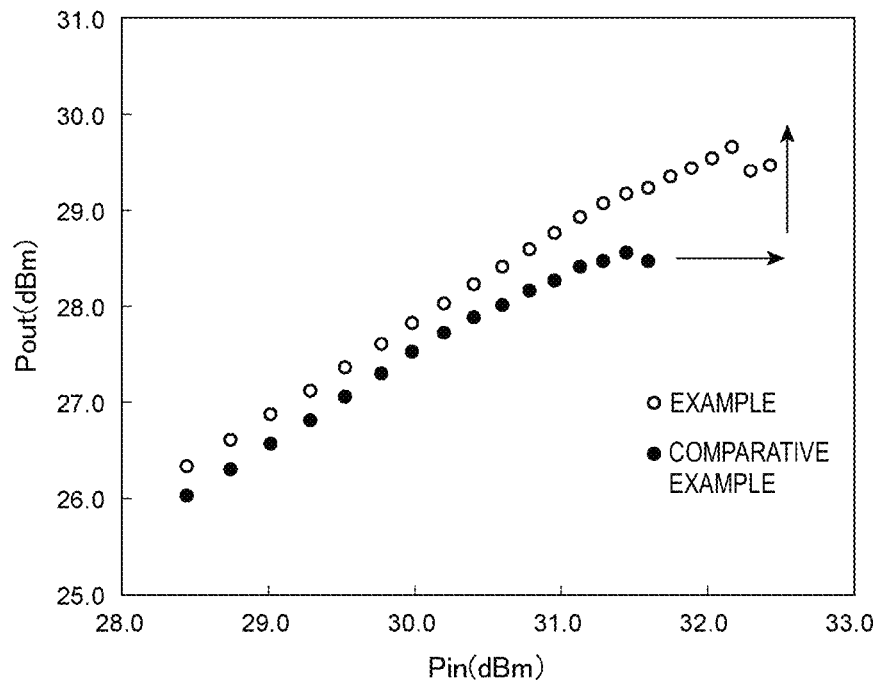
FIG. 10 illustrates the relationship between input power Pin and output power Pout in an acoustic wave device according to an Example and in an acoustic wave device according to a Comparative Example.

For each of the acoustic wave device according to Example and the acoustic wave device according to Comparative Example, power is applied to the acoustic wave device from the resonant terminal, that is, from the input side, and the power at the output side is measured. FIG. 10 illustrates the relationship between the power at the input side, Pin, and the power at the output side, Pout. As is apparent from FIG. 10, in comparison to Comparative Example, the configuration according to Example allows for greater output power Pout for the same input power. Furthermore, with Comparative Example, at input power Pin exceeding about 31.5 dBm, a breakdown occurs, which renders further application of power impossible. This is presumed to be due to fusing of the IDT electrode. That is, it is apparent that the acoustic wave device according to Example makes it possible to improve heat dissipation more effectively than the acoustic wave device according to Comparative Example.

Figure 11:
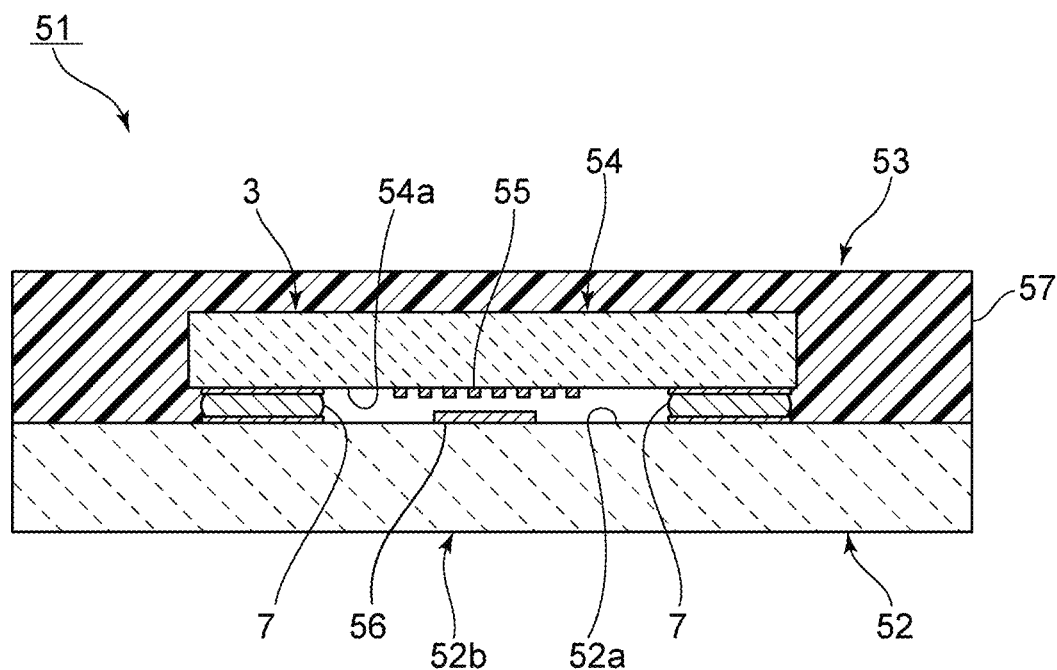
FIG. 11 is a front cross-sectional view of an acoustic wave device according to a second preferred embodiment of the present invention.

FIG. 11 is a front cross-sectional view of an acoustic wave device according to a second preferred embodiment of the present invention. A mounting substrate 52 of an acoustic wave device 51 includes a first major surface 52a and a second major surface 52b. A metal film having a substantially flat shape is located on the first major surface 52a as a heat radiation pattern 56. In an area not illustrated in FIG. 11, the heat radiation pattern 56 is connected to a metal film or a via-conductor such that heat is dissipated toward the internal layers of the mounting substrate 52 or toward the second major surface 52b.

An acoustic wave element chip 53 includes a piezoelectric substrate 54. An IDT electrode as a functional electrode 55 is located on a first major surface 54a of the piezoelectric substrate 54. The heat radiation pattern 56 is located so as to face the functional electrode 55.

A sealing resin layer 57 is located so as to seal the piezoelectric substrate 54.

As described above, the acoustic wave device 51 as well is provided with the heat radiation pattern 56. This allows heat generated in the location of the functional electrode 55 to effectively escape. Therefore, the acoustic wave device 51 with improved heat dissipation can be provided.

Figure 12:
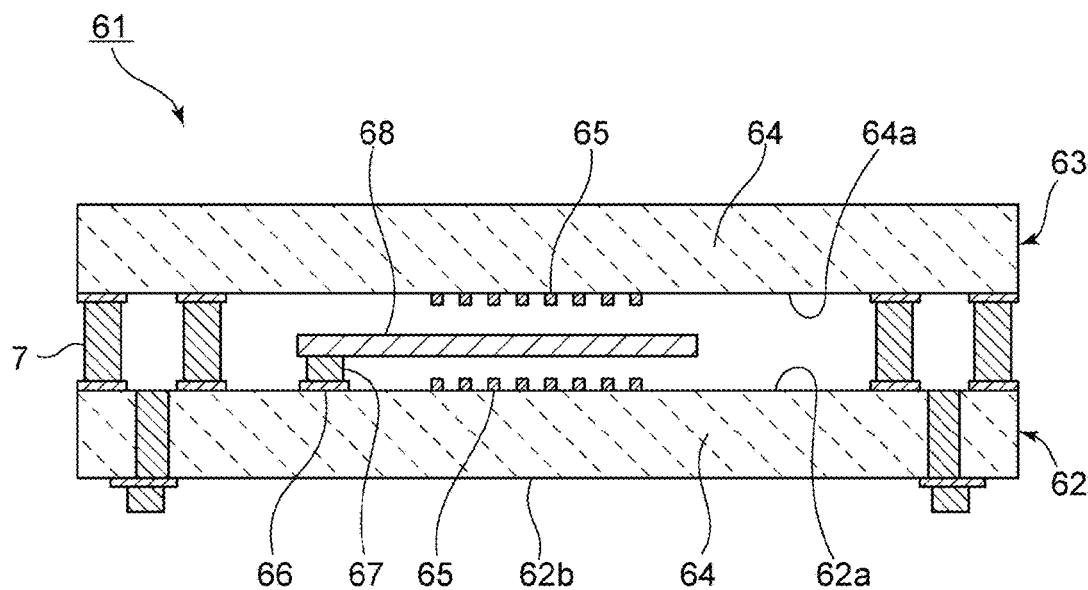
FIG. 12 is a front cross-sectional view of an acoustic wave device according to a third preferred embodiment of the present invention.

FIG. 12 is a front cross-sectional view of an acoustic wave device according to a third preferred embodiment of the present invention. In an acoustic wave device 61, an acoustic wave element chip 63 is mounted to a mounting substrate 62.

In this regard, the mounting substrate 62 preferably includes a piezoelectric substrate 64. A functional electrode 65 is located on a first major surface 62a. An acoustic wave element is thus provided on the mounting substrate 62 as well. The acoustic wave element chip 63 includes the piezoelectric substrate 64. The functional electrode 65 is located on a first major surface 64a of the piezoelectric substrate 64. The first major surface 64a of the piezoelectric substrate 64 of the acoustic wave element chip 63, and the first major surface 62a of the mounting substrate 62 face each other with a space therebetween. A metal film 66 is located on the first major surface 62a of the mounting substrate 62. A heat radiation pattern 68 is secured to the metal film 66 by use of a bonding agent 67. The heat radiation pattern 68 is a plate-shaped component made of a material with superior heat conduction such as a metal.

The heat radiation pattern 68 is located so as to extend to the location where the functional electrode 65 of the acoustic wave element chip 63, and the functional electrode 65 on the first major surface 62a of the mounting substrate 62 face each other. That is, the functional electrode 65 is located in the space where the functional electrodes 65 face each other.

The heat radiation pattern 68 is cantilevered onto the metal film 66 by the bonding agent 67.

The bonding agent 67 may be any bonding agent with superior thermal conductivity. Preferred examples of the bonding agent include solder. As a result, heat generated in the functional electrode 65 of each of the upper and lower acoustic wave elements is allowed to quickly escape toward the inner layers of the mounting substrate 62 by way of the heat radiation pattern 68. As described above, an acoustic wave element may be further provided on the mounting substrate 62. In that case, the heat radiation pattern 68 is preferably located between the functional electrode 65 on the acoustic wave element chip 63, and the functional electrode 65 on the mounting substrate 62.

Figure 13:
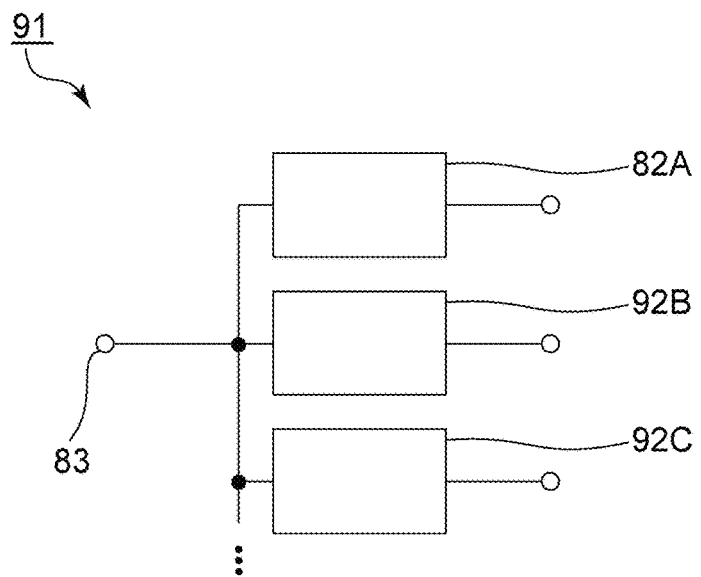
FIG. 13 is a circuit diagram illustrating an exemplary composite filter device according to a preferred embodiment of the present invention.

FIG. 13 is a circuit diagram illustrating an exemplary composite filter device according to a preferred embodiment of the present invention. In a composite filter device 91, multiple bandpass filters including bandpass filters 82A, 92B, and 92C are each connected at one end to a common terminal 83. By using an acoustic wave device according to a preferred embodiment of the present invention as a resonator in at least one of the bandpass filters including the bandpass filter 82A, 92B, and 92C, the bandpass filter including the acoustic wave device can be improved in heat dissipation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a mounting substrate including a first major surface and a second major surface that face each other, the first major surface being a major surface on which a bump-mounting electrode land used for bump mounting is provided; and
an acoustic wave element chip including:
a piezoelectric substrate including a major surface; and
a functional electrode, and a bump used for mounting, the functional electrode and the bump being located over the major surface of the piezoelectric substrate; wherein
the bump of the acoustic wave element chip is joined to the bump-mounting electrode land located on the first major surface of the mounting substrate;
the acoustic wave device further comprises a heat radiation pattern located over the first major surface of the mounting substrate, the heat radiation pattern being located within a region facing the functional electrode of the acoustic wave element chip;
the heat radiation pattern is connected to an internal layer portion of the mounting substrate located between the first major surface and the second major surface; and
the heat radiation pattern is not electrically connected to the bump-mounting electrode land on the first major surface.

2. The acoustic wave device according to claim 1, further comprising a via-conductor extending to the first major surface of the mounting substrate, wherein the heat radiation pattern is connected to the via-conductor.

3. The acoustic wave device according to claim 1, further comprising a via-conductor extending to the first major surface of the mounting substrate, wherein the heat radiation pattern is located in a space between the functional electrode of the acoustic wave element chip and the first major surface of the mounting substrate, and connected to the via-conductor.

4. The acoustic wave device according to claim 1, wherein the heat radiation pattern is made of a metal or an insulating material.

5. The acoustic wave device according to claim 1, wherein
the functional electrode includes a plurality of IDT electrodes;
the heat radiation pattern includes a plurality of heat radiation patterns corresponding one-to-one to the plurality of IDT electrodes; and
each one heat radiation pattern of the plurality of heat radiation patterns does not overlap at least two IDT electrodes of the plurality of IDT electrodes in plan view.

6. The acoustic wave device according to claim 1, wherein the heat radiation pattern is identical in planar shape to a portion of the via-conductor, the portion being a portion of the via-conductor exposed on the first major surface of the mounting substrate.

7. The acoustic wave device according to claim 1, wherein
the functional electrode includes a plurality of IDT electrodes; and
the heat radiation pattern is positioned to face an IDT electrode of the plurality of IDT electrodes that generate a greatest amount of heat per unit time.

8. The acoustic wave device according to claim 5, wherein the plurality of heat radiation patterns are connected to a location on or near the second major surface of the mounting substrate.

9. The acoustic wave device according to claim 1, wherein the functional electrode of the acoustic wave element chip and the heat radiation pattern are separated by a distance of less than or equal to about 70 μm.

10. The acoustic wave device according to claim 1, further comprising:
a ladder filter including a plurality of series-arm resonators and a plurality of parallel-arm resonators, the plurality of series-arm resonators and the plurality of parallel-arm resonators each including an acoustic wave resonator including an IDT electrode; wherein
the plurality of series-arm resonators include a first series-arm resonator and a second series-arm resonator different from the first series-arm resonator, the first series-arm resonator being a series-arm resonator with a highest resonant frequency;
the plurality of parallel-arm resonators include a first parallel-arm resonator and a second parallel-arm resonator different from the first parallel-arm resonator, the first parallel-arm resonator being a parallel-arm resonator with a lowest anti-resonant frequency; and
the heat radiation pattern is positioned to face the IDT electrode of the second series-arm resonator, or the IDT electrode of the second parallel-arm resonator.

11. The acoustic wave device according to claim 1, further comprising:
a ladder filter including a plurality of series-arm resonators and a plurality of parallel-arm resonators, the plurality of series-arm resonators and the plurality of parallel-arm resonators each including an acoustic wave resonator including an IDT electrode; wherein
the plurality of series-arm resonators include a first series-arm resonator and a second series-arm resonator different from the first series-arm resonator, the first series-arm resonator being a series-arm resonator with a largest total capacitance;

the plurality of series-arm resonators include a first series-arm resonator and a second series-arm resonator different from the first series-arm resonator, the first series-arm resonator being a series-arm resonator with a smallest total capacitance; and the heat radiation pattern is positioned to face the IDT electrode of the second series-arm resonator, or the IDT electrode of the second parallel-arm resonator.

12. A composite filter device comprising:
a plurality of bandpass filters connected at one common end; wherein
at least one of the plurality of bandpass filters includes the acoustic wave device according to claim 1.

13. The composite filter device according to claim 12, wherein each of the plurality of bandpass filters is the acoustic wave device.

14. The composite filter device according to claim 12, wherein the acoustic wave device further comprises a via-conductor extending to the first major surface of the mounting substrate, wherein the heat radiation pattern is connected to the via-conductor.

15. The composite filter device according to claim 12, wherein the heat radiation pattern is located in a space between the functional electrode of the acoustic wave element chip and the first major surface of the mounting substrate, and connected to the via-conductor.

16. The composite filter device according to claim 12, wherein the heat radiation pattern is made of a metal or an insulating material.

17. The composite filter device according to claim 12, wherein
the functional electrode includes a plurality of IDT electrodes;
the heat radiation pattern includes a plurality of heat radiation patterns corresponding one-to-one to the plurality of IDT electrodes; and
each one heat radiation pattern of the plurality of heat radiation patterns does not overlap at least two IDT electrodes of the plurality of IDT electrodes in plan view.

18. The composite filter device according to claim 12, wherein the heat radiation pattern is identical in planar shape to a portion of the via-conductor, the portion being a portion of the via-conductor exposed on the first major surface of the mounting substrate.

19. The composite filter device according to claim 12, wherein
the functional electrode includes a plurality of IDT electrodes; and
the heat radiation pattern is positioned to face an IDT electrode of the plurality of IDT electrodes that generate a greatest amount of heat per unit time.

20. The composite filter device according to claim 17, wherein the plurality of heat radiation patterns are connected to a location on or near the second major surface of the mounting substrate.

* * * * *